(12) United States Patent
Baier et al.

(10) Patent No.: US 12,719,518 B2
(45) Date of Patent: Aug. 25, 2026

(54) INTERFERER CANCELLATION DEVICE

(71) Applicant: NXP B.V., Eindhoven (NL)

(72) Inventors: Thomas Baier, Graz (AT); Jens Fleischhacker, Hamburg (DE); Jan van Sinderen, Liempde (NL)

(73) Assignee: NXP B.V., Eindhoven (NL)

( * ) Notice: Subject to any disclaimer, the term of this patent is extended or adjusted under 35 U.S.C. 154(b) by 60 days.

(21) Appl. No.: 18/519,033

(22) Filed: Nov. 26, 2023

(65) Prior Publication Data

US 2024/0204812 A1 Jun. 20, 2024

(30) Foreign Application Priority Data

Dec. 15, 2022 (EP) .................................... 22213758

(51) Int. Cl.
*H04B 1/10* (2006.01)
*H03M 1/12* (2006.01)

(52) U.S. Cl.
CPC ............ *H04B 1/1036* (2013.01); *H03M 1/12* (2013.01); *H04B 2001/1072* (2013.01)

(58) Field of Classification Search
CPC .. H04B 1/0007; H04B 1/1009; H04B 1/1027; H04B 1/1036; H04B 1/525; H04B 2001/1072; H03M 1/12
See application file for complete search history.

(56) References Cited

U.S. PATENT DOCUMENTS 8,055,235 B1 * 11/2011 Gupta ...................... H04B 1/10 455/296
2019/0222458 A1 * 7/2019 Damm .................. H04L 27/364

FOREIGN PATENT DOCUMENTS

WO 2005125016 A1 12/2005
WO 2006046188 A1 5/2006
WO 2016073934 A1 5/2016

OTHER PUBLICATIONS

Feely, Orla, "Theory of lowpass and bandpass sigma-delta modulation," IEE Colloquium on Oversampling and Sigma-Delta Strategies for DSP, Nov. 23, 1995, 8 pages.
Ahmed et al., Blocker Tolerant Sigma Delta ADC, 2019, 36th National Radio Science Conference (NRSC 2019), Apr. 16-18, 2019, 8 pages.
Rayudu et al., "An N-Path Filter with Multiphase PWM Clocks for Harmonic Response Suppression," 2020 IEEE 11th Latin American Symposium on Circuits & Systems (LASCAS), Feb. 25-28, 2020,.
NXP, "NFC Forum-Compliant Frontend IC with Superior RF Performance for Automotive" downloaded from the internet Sep. 22, 2023, 5 pages.
U.S. Appl. No. 17/822,951 Robert Van Veldhoven, "Interface Circuit and Method for Providing DC Bias Voltage Correction," filed Aug. 29, 2022.
Tao, Hai et al; "A 400-Ms/s Frequency Translating Bandpass Sigma-Delta Modulator"; IEEE Journal of Solid-State Circuits, vol. 34, Issue; pp. 1741-1752; Dec. 1999; DOI: 10.1109/4.808899.

* cited by examiner

*Primary Examiner* — David B Lugo

(57) ABSTRACT

Interferer cancellation device, including a device with an antenna input to receive a signal, wherein the signal comprises a wanted signal together with an unwanted interferer; and a feedback device, built to reconstruct the unwanted interferer interfering with the wanted signal into digital and to convert a reconstructed interferer into analog, wherein the reconstructed interferer is subtractable from the received signal at the antenna input.

18 Claims, 7 Drawing Sheets

INTERFERER CANCELLATION DEVICE

CROSS-REFERENCE TO RELATED APPLICATIONS

This application claims the priority under 35 U.S.C. § 119 of European Patent application no. 22213758.0, filed on 15 Dec. 2022, the contents of which are incorporated by reference herein.

TECHNICAL FIELD

The present disclosure relates to a interferer cancellation device. Furthermore, the present disclosure relates to a method for operating an interferer cancellation device. Furthermore, the present disclosure relates to a computer implemented method for carrying out the proposed method.

BACKGROUND

Band-pass Sigma-Delta ADCs are used to maximize dynamic range around a certain (carrier-) frequency and can be used for Direct-Sampling in RF receivers without the need of analog mixers for down-conversion to baseband. In some systems (like NFC) the dynamic range is limited by a large carrier signal from the transmitter (that works in parallel to the receiver), which is an interferer with e.g. >80 dB stronger amplitude than the wanted modulation signal that should be received. This is also the case for other bi-directional systems that transmit and receive in parallel or for systems which are affected by large external interferers.

Salsabeel H. Ahmed, et al., Blocker Tolerant Sigma Delta ADC, 36th National Radio Science Conference 2019 shows a Sigma-Delta that uses already existing feedback DAC to cancel the interferer. Disclosed is a technique for blocker rejection in sigma-delta analog to digital converters (SDADC).

SUMMARY

According to a first aspect of the present disclosure there is provided a interferer cancellation device, comprising:

- a device with an antenna input to receive a signal, wherein the signal comprises a wanted signal together with an unwanted interferer; and
- a feedback device, built to reconstruct the unwanted interferer interfering with the wanted signal into digital and to convert a reconstructed interferer into analog, wherein the reconstructed interferer is subtractable from the received signal at the antenna input.

In this way, an interferer cancellation ADC with high dynamic range around a specified wanted frequency is provided. As a consequence, the device is not overdriven by strong unwanted interferer signals, such that the device can be operated with a higher gain. Advantageously, a strong unwanted interferer signal can be removed and cannot overdrive the ADC.

According to a further aspect there is provided a method to operate an interferer cancellation device, comprising the steps:

- receiving a signal comprising a wanted signal together with an unwanted interferer at an input;
- recovering the interferer into digital;
- reconstructing the recovered interferer into analog; and
- subtracting the reconstructed interferer from the signal at the input.

According to a further aspect there is provided a computer implemented method comprising executable instructions which, when executed by an interferer cancellation device cause said interferer cancellation device to carry out the proposed method.

According to an embodiment, the reconstruction of the interferer is done by means of a recovery element.

According to a further embodiment, at least one feedback DAC is used for the conversion of the reconstructed interferer back into analog.

A further embodiment is characterized in that the at least one feedback DAC is built such that quantization error resulting in harmonic content of the at least one feedback DAC are outside of the side bands of the signal. In this way, quantization error of the feedback DAC cannot disturb sidebands of the wanted signal. In other words, the feedback DAC generates “discrete sounds”, which do not interfere with the wanted modulation sidebands of the data signal.

According to a further embodiment quantization errors generated by the feedback DAC are defined weaker than the interferer. In effect, the power of the harmonic content cannot override the ADC in contrary to a not-cancelled unwanted interferer. In this way the method not only applies for harmonics of a periodic-steady reconstruction but also for the quantization error during tracking.

According to a further embodiment, a band-pass filter is used to limit the bandwidth of the feedback DAC, such that a quantization error of the feedback DAC does not interfere with the sidebands of the signal.

According to a further embodiment, the feedback device comprises two feedback DACs. The two feedback DACs can be quadrature phase and operating at an intermediate frequency of directly at baseband.

According to a further embodiment, low pass filters in quadrature baseband are used to limit a bandwidth of the signals of the feedback DACs, such that a quantization error of the feedback DACs does not interfere with the wanted modulation sidebands of the data signal. In this embodiment desensitization of the receiver due to added noise of the quantization error is reduced. This takes into account the fact that signal strengths change constantly in practical operation, wherein noise of the feedback DACs is limited to a narrow bandwidth around the interferer. In case of the embodiment illustrating two feedback DACs at an intermediate or at baseband frequency, the band-pass filter becomes a low-pass after the DACs to simplify implementation.

According to a further embodiment, the interferer, reconstructed by the quadrature phase feedback DACs, is up-converted to a center frequency of the carrier or interferer by means of up-conversion mixers.

According to a further embodiment, the device is an bandpass Sigma Delta ADC. In this way an exemplary application of the interferer cancellation device is implemented. Such type of ADC has a feedback loop which is designed to subtract the quantized signal from the input and to shape the resulting quantization error to optimize dynamic range around a certain frequency-band and has already a high dynamic range in the narrow bandwidth.

With the proposed disclosure said dynamic range can even be increased further. However, the proposed interferer cancellation device can also be applied in alternative scenarios.

According to a further embodiment, the feedback DAC of the feedback device is a narrow-bandwidth feedback DAC compared to the wide-bandwidth of the noise-shaping DAC of the Sigma Delta ADC.

According to a further embodiment, the interferer is a periodic-steady carrier.

BRIEF DESCRIPTION OF DRAWINGS

The aspects defined above and further aspects of the present disclosure are apparent from the examples of embodiment to be described hereinafter with reference to the appended drawings, which are explained with reference to the examples of embodiment. However, the disclosure is not limited to the examples of embodiment.

All illustrations in the drawings are schematical. It is noted, that in different figures, similar or identical elements or features are provided with the same reference signs or with reference signs, which are different from the corresponding reference signs only within the first digit. In order to avoid unnecessary repetitions elements or features which have already been elucidated with respect to a previously described embodiment are not elucidated again at a later position of the description.

DESCRIPTION OF EMBODIMENTS

The present disclosure proposes an interferer cancellation device, e.g. implemented as a combination of a band-pass sigma delta ADC (BP-SDADC) with a low-noise interferer cancellation feedback.

Compared to known BP-SDADCs, by means of the proposed interferer cancellation device the dynamic range can be improved by cancelling strong interferer or carrier signals before they enter a loop-filter of the ADC. In contrary to prior-art N-path filters, the interferer or carrier is cancelled based on the digital output of the BP-SDADC itself, avoiding any offset issues in separate N-path filters. ADC and cancellation is one single closed loop. Furthermore, the digital feedback allows cancellation of any signal, not just a single-tone carrier (e.g. it could also cancel modulated interferers).

The present disclosure can be applied e.g. for NFC-applications, where a strong carrier signal generated by the reader device is used to supply a passive tag (card) over a magnetic field. At the same time, the card is using this field to modulate the data back to the reader device which is received by reader as weak change in amplitude on the antenna. The reader must be able to successfully demodulate the weak data signal of the card with the presence of the strong carrier signal of its own transmitter.

In the following, a removal of an unwanted interferer, formed as a carrier C from a received signal (wanted signal+unwanted carrier) is explained in more detail. In alternative embodiments (not shown in Figures), the proposed interferer cancellation device also works in more generic scenarios for a removal of an unwanted interferer from a combined received signal (wanted signal+unwanted interferer).

Figure 1:
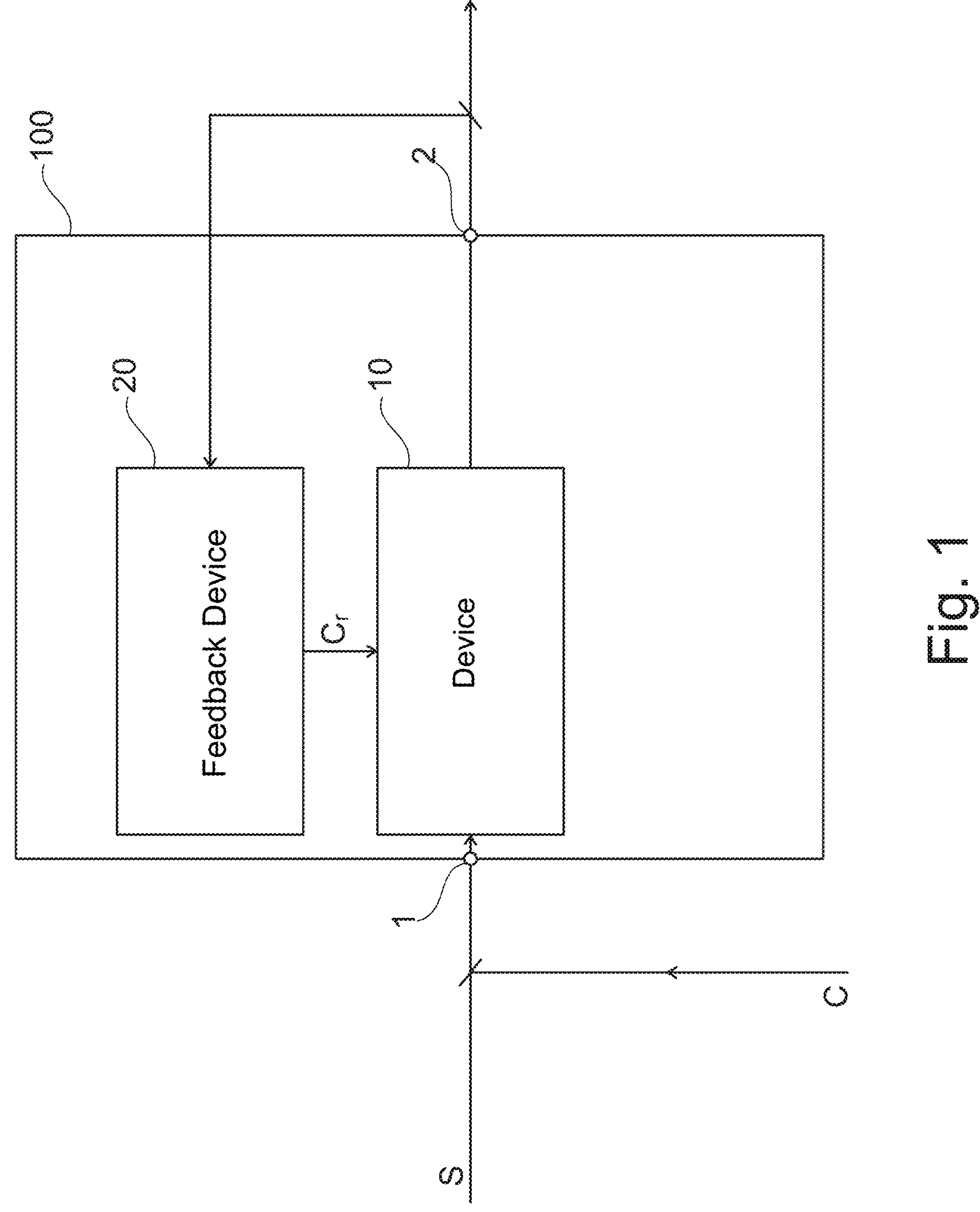
FIG. 1 shows a block diagram of a proposed interferer cancellation device.

FIG. 1 shows a block diagram of a proposed interferer cancellation device 100. One recognizes a device 10 and a feedback device 20 for recovering and subtracting a reconstructed carrier $C_r$. The device 10 can be an analog-to-digital converter (ADC), a high gain amplifier, etc. One recognizes the proposed interferer cancellation device 100, wherein a wanted modulated signal S is applied at an input 1. Furthermore, from a transmitter (not shown) a strong unwanted carrier C is also applied at the input 1. A feedback loop comprises a feedback circuit 20, which reconstructs the carrier or interferer C in digital form and subtracts the reconstructed carrier $C_r$ in analog from the input signal S. As a result, at an output 2 of the interferer cancellation device 100, a signal can have much more gain than without the proposed intervention.

Figure 2:
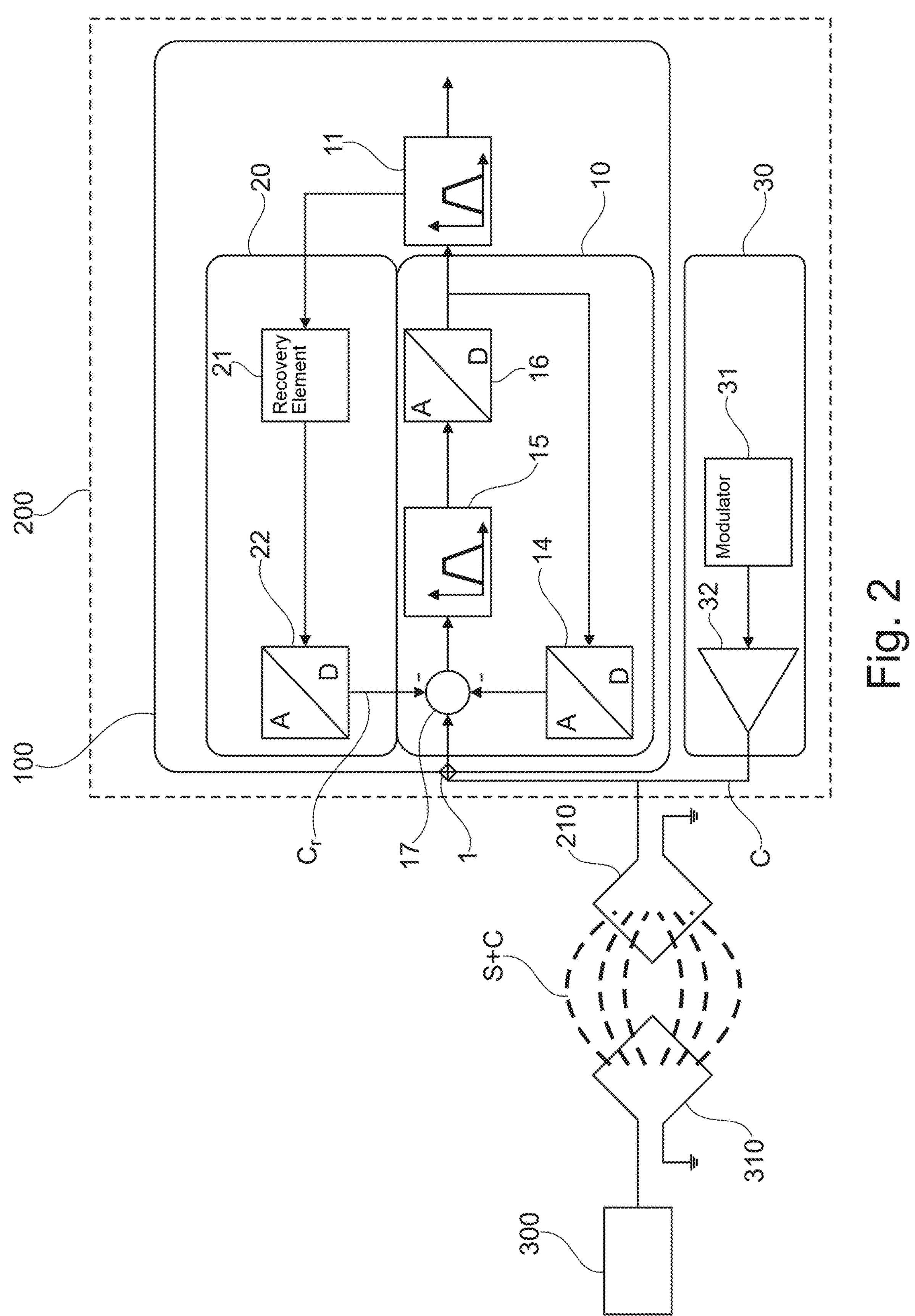
FIG. 2 shows an exemplary application of the proposed interferer cancellation device with a NFC reader device.

FIG. 2 shows a block diagram with an application of the proposed interferer cancellation device 100 in combination with a reader device 200 (e.g. NFC reader) which is required to receive data signals up to 80 dB below the strong carrier C received directly from a transmitter 30 with a modulator 31 and a power amplifier 32 of the same reader device 200.

The reader device 200 comprises an interferer cancellation device 100 with an input 1, which receives the strong unwanted carrier C from its own transmitter 30 together with a wanted modulated signal S having been modulated onto the carrier C. An output signal of the transmitter 30 is applied at an antenna 210 of the reader device 200. At the same time, the antenna input 1 receives a very weak load modulated signal from the card 300, which performs load modulation and communicates the load modulated signal S by means of an antenna 310 coupled with the antenna 210 of the reader device 200. That is, the card 300 is adding very weak sideband modulation. The load modulated signal S contains a weak load modulation onto a strong carrier C. As a consequence, there is a high dynamic range between the carrier or interferer C and the modulated signal S received from the card 300.

Proposed is a removal of the carrier or interferer C from the modulated signal S. By removing the carrier C, a gain of the whole interferer cancellation device 100 can considerably be improved without overdriving it. By means of feedback device 20 only the weak sideband modulated signal is remain at the input 1 without the strong carrier or interferer C. The carrier or interferer C is removed in order to increase the gain for the ADC to be more sensitive on this weak modulated signal.

In the given example, the device 10 is an ADC built as a BP-SDADC, which is directly connected to the antenna 210 without additional amplifiers, mixer, and other conventional building blocks. and this makes it attractive due to its simplicity and the few components required. A loop filter 15 of the BP-SDADC is provided to shape quantization error of the wide-bandwidth feedback DAC of the BP-SDADC. In this example, a quantizer 16 formed as a single bit slicer converts the signal into the digital domain. The feedback device 20 comprises a one bit DAC 22, which is foreseen to provide an analog signal of the quantized signal which is subtracted at the subtracter 17. In this way, a certain dynamic range is get based on how many bits are put into the operation DAC 14, the design of the loop filter 15 and the decimation filter 11. The proposed interferer cancellation device 100 is able to improve the dynamic range even further. The carrier or interferer C is reconstructed in digital form by means of a recovery element 21 and is applied to a feedback DAC 22, which converts the carrier C back to analog. The reconstructed analog carrier $C_r$ is then subtracted at the subtracter 17, thus preventing that the carrier C enters the loop filter 15. The only purpose of the feedback DAC 22 is to cancel a narrow bandwidth around the carrier C.

The operation DAC 14 is rather a wide band feedback DAC which really optimizes the dynamic range around a certain frequency (frequency of the carrier or interferer C and the signal S) with e.g. 2 MHz of bandwidth. In contrast there to, the feedback DAC 22 of the feedback device 20 is a using a DAC generating a narrow bandwidth or single tone signal at the frequency of the carrier C. The main purpose which is intended with the feedback DAC is to cancel the strong carrier or interferer C from the signal S at the input 1 of the reader device 200.

The digital output of the device 10 is applied to a decimation filter 11, which reduces the high frequency noise of the BP-SDADC and also reduces the bandwidth further down to the wanted signal S together with unwanted strong carrier or interferer C.

On-top of the carrier or interferer reconstruction, this band-limited signal is also intended to be further used by a digital signal processor (DSP, not shown) for demodulation after the strong carrier was be removed.

However, the single feedback DAC 22 of the arrangement of FIG. 2 has a limited time and amplitude resolution. In case of adjusting the carrier or interferer amplitude or phase during the reception of the weak wanted sideband modulation, the resolution of this DAC determines how much noise is added during adjustments by the interferer cancellation device 100.

Figure 3:
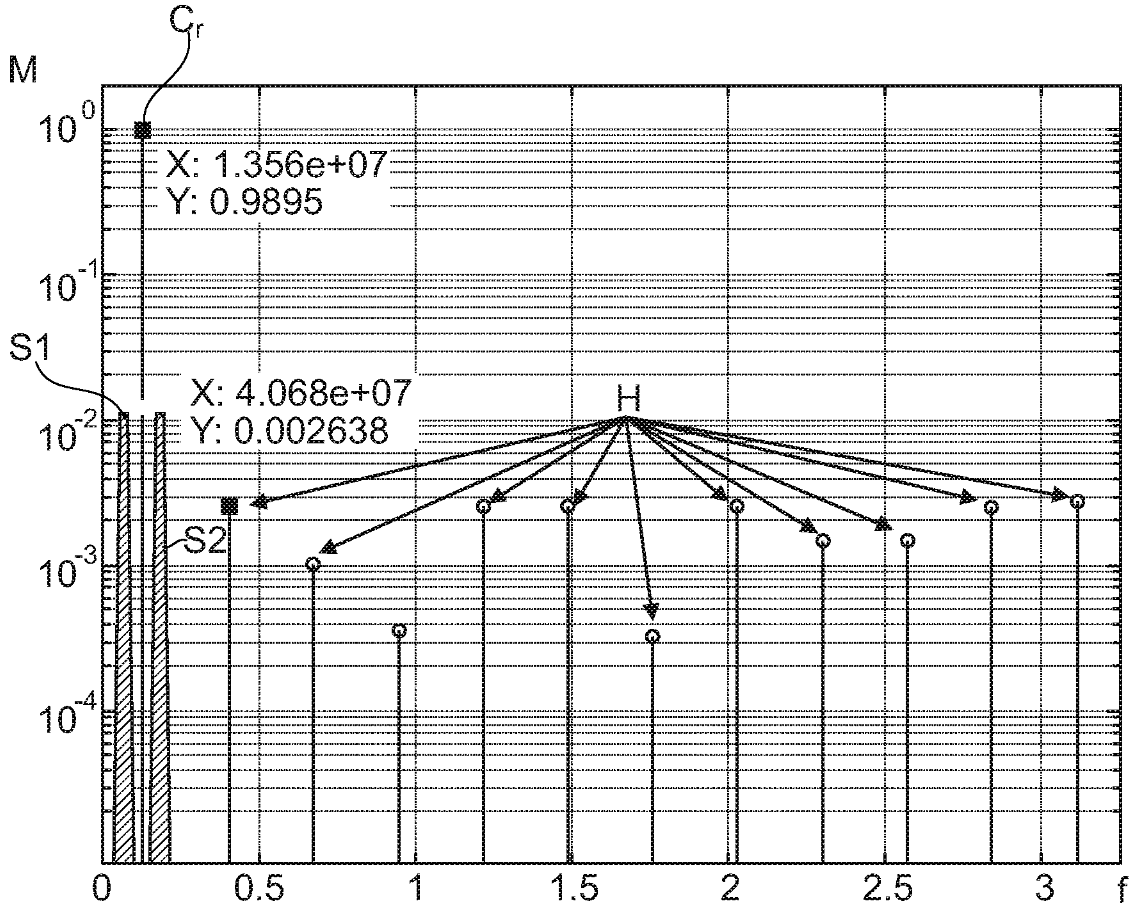
FIG. 3 shows a Nyquist spectrum of an approximated 5+1 bit sine as an example for the reconstructed carrier that shall be removed in front of the ADC.

FIG. 3 shows a possible result of the feedback DAC 22 of the feedback device 20 in the frequency domain with a magnitude over frequency f in case of reconstructing a periodic-steady sine-wave. One recognizes the reconstructed carrier or interferer $C_r$, that cancels the strong carrier C at the input of the device 10. The feedback DAC 22 has a limited time and amplitude resolution, e.g. six bit in the shown case with a defined sampling frequency of 48× the carrier frequency, which results in a remaining error. The quantization error is represented in harmonics of the carrier or interferer C. One recognizes the $3^{rd}$ harmonics H at 40 MHz (3×13.56 MHz), $5^{th}$ harmonics, and so on, due to limited resolution to reconstruct the sine wave of the carrier C. The harmonics H do not overlap the wanted modulations signal S. In order to reconstruct the carrier C, the digitally filtered signal is passed to a digital quadrature mixer with additional low pass filters (shown as recovery element 21), to recover amplitude and phase of the strong carrier C. The recovered carrier is then reconstructed in a high speed feedback DAC 22 and subtracted at the subtracter 17. One recognizes, that the harmonics H do not interfere with the wanted modulation sidebands S1, S2 around the carrier C.

In contrary to the noise-shaping operation DAC 14 of the conventional BP-SDADC, the spectrum example in FIG. 3 shows the interferer cancellation feedback DAC 22 constructing a periodic-steady approximated sine-wave and the quantization-error of this DAC 22 is only concentrated at the harmonic frequencies of re-constructed carrier. These harmonics are already attenuated compared to the fundamental and do not overdrive the ADC formed as SDADC anymore like the unwanted carrier C would if it wasn't removed from the input. Further filtering in digital remove these harmonic" components without affecting the wanted side-band frequencies around the carrier.

FIG. 3 shows an example of the harmonics for 5+1 (sign) bit DAC running at 48×fc generating an approximated sine-wave for the reconstructed carrier. Note that for the scheme to work, the gain of the device 10 formed as BP-SDADC first needs to be reduced during the acquisition phase of the carrier C to not overdrive it before the carrier is removed.

Figure 4:
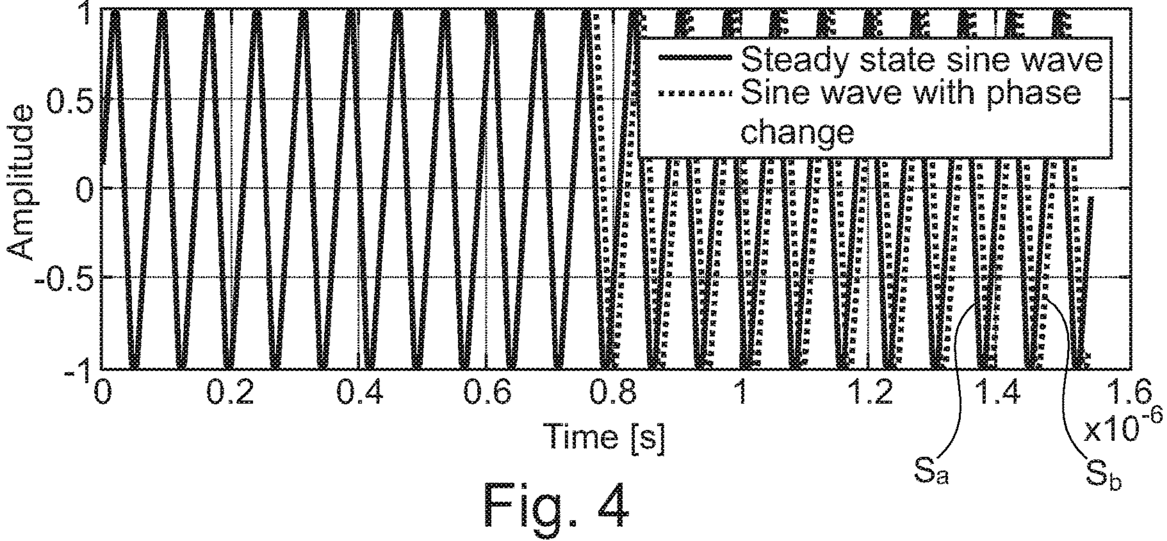
FIG. 4 shows an amplitude diagram over time with phase shifted signals due to discrete steps within the tracking.

FIG. 4 indicates a limitation with the previously explained architecture although the DAC creates very little noise interfering with the wanted side-band modulation if a constant tone generated by the feedback DAC 22 of the feedback device 20. However, as soon as any kind of phase or amplitude tracking is performed during the frame reception of the wanted data modulation, the transient noise of this limited resolution DAC can interfere with the baseband data S1, S2 (shown in FIG. 3, but not shown in FIG. 4) after the digital matched filter output illustrated in FIG. 5. This can e.g. be the case, when the reader device 200 with the interferer cancellation device 100 approaches the card 300 which changes the load on the reader antenna 210 and furthermore the carrier level. FIG. 4 only shows the effect on phase-step of the reconstructed carrier $C_r$ feedback DAC, not including the to be cancelled carrier C. One recognizes a carrier with 13.56 MHz being generated by the feedback DAC 22. In one shown case, the phase is a periodic-steady sine wave Sa. In another shown case, a phase change is performed with 60 degree (e.g. corresponding to one cycle shift of an 6× oversampled DAC), resulting in a sine wave Sb with abrupt phase change. For the case with a constant periodic-steady sine wave Sa as reconstructed carrier, the demodulated signal $P_a$ stays at constant or even zero in the digital baseband after the matched filter, because the high frequency harmonics created by the DAC are not interfering with the baseband and filter out. In contrast thereto, due to the above mentioned phase change of about 60° one recognizes a signal Pb, which due to the sharp step, creates also a transient spike in the baseband after the matched filter which interferes with the wanted modulation data.

Figure 5:
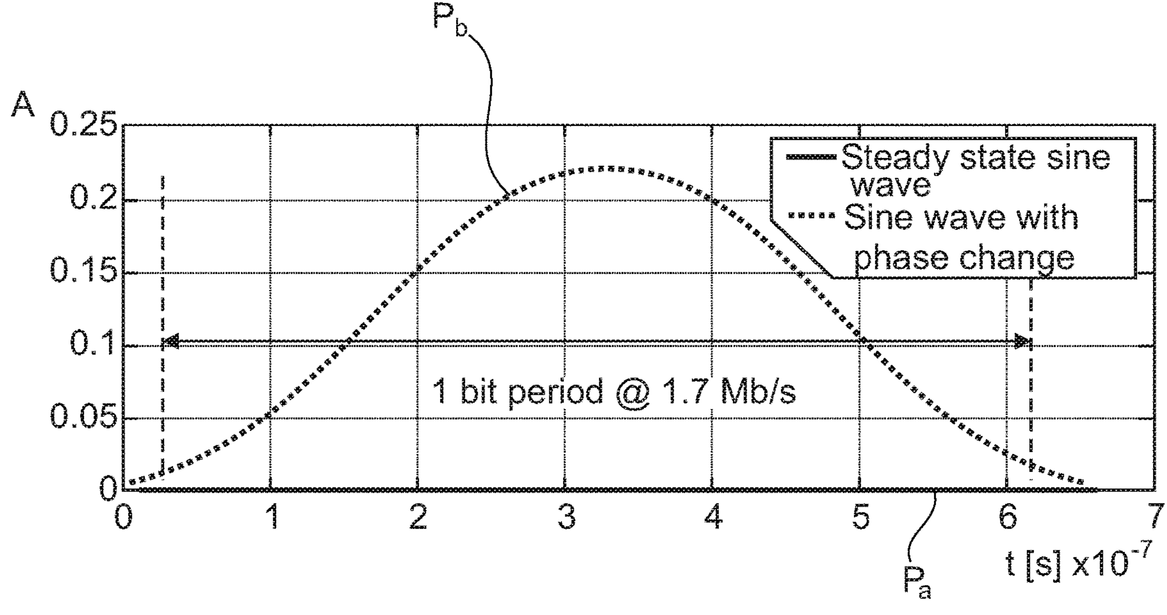
FIG. 5 shows an effect of the discrete steps during tracking of FIG. 4 without filtering quantization error after the digital baseband filter.

In other words, FIG. 5 shows an adverse effect of the transients resulting from the step in the filtered baseband domain in a case of the phase shift of FIG. 5 this could result in adverse effects. Similar behaviour results from steps in the amplitude resulting from the limited resolution of the interferer cancellation devices 100. Without any amplitude or phase change, the Sa indicates a clean digital baseband signal where the carrier is completely removed, while Sb indicates an effect of the small phase step done to track the signal. FIG. 5 shows a matched filter output in digital of the conditions of FIG. 4. The output of the matched filter is the down-converted baseband signal, matched to a data symbol. If a periodic-steady state signal is present without any step response then $P_a$ this is a flat line, and in this case zero due to the digital filter with a notch at 0 Hz (Manchester Matched Filter, MMF) which also filters the DC-component. If there is no step, then the output of the matched filter is constant. However, as soon as there is a phase shift, this results in a corresponding output of the filter.

As higher the time and amplitude resolution of the feedback DAC 22, as lower the transient response in the filtered baseband domain can be made. However these high resolution requirements of the feedback DAC 22, can make the actual implementation rather complex. Optimizations can be made, by e.g. digital compensation of the DAC step or by applying steps at less sensitive times (e.g. on the edge between two data-bits). However these measures are sensitive to accurate timing and analog imperfections. This can be avoided by a band-pass filter after the reconstruction DAC to limit the generated quantization error to a narrow bandwidth around the unwanted carrier or interferer, not interfering with the wanted modulations side-bands. One approach to generate a narrow bandwidth band-pass filter is shown in the arrangement of FIG. 6.

Here, a down-conversion is done by means of the carrier recovery element 21, wherein the carrier is mixed down to base band frequency. That means that the process of carrier recovery is done in baseband as well as the carrier reconstruction is done around 0 Hz by in-phase and quadrature-phase DACs, such that subsequent low pass filters 23*a*, 23*b* can be inserted after the feedback DACs 22*a*, 22*b*, wherein by means of low pass filters 23*a*, 23*b* around 0 Hz, the noise of the feedback DACs is limited to a narrow bandwidth around carrier. By means of up-conversion mixers 24*a*, 24*b* the reconstructed carrier or interferer is upconverted to the carrier frequency, wherein the recovered carrier $C_r$ is then subtracted from the input signal S at the subtracter 17. Moreover, by means of the low pass filters 23*a*, 23*b* and the up-conversion mixers 24*a*,24*b* the noise of the feedback DACs 22*a*, 22*b* can be limited to a small bandwidth around carrier or interferer C.

Figure 6:
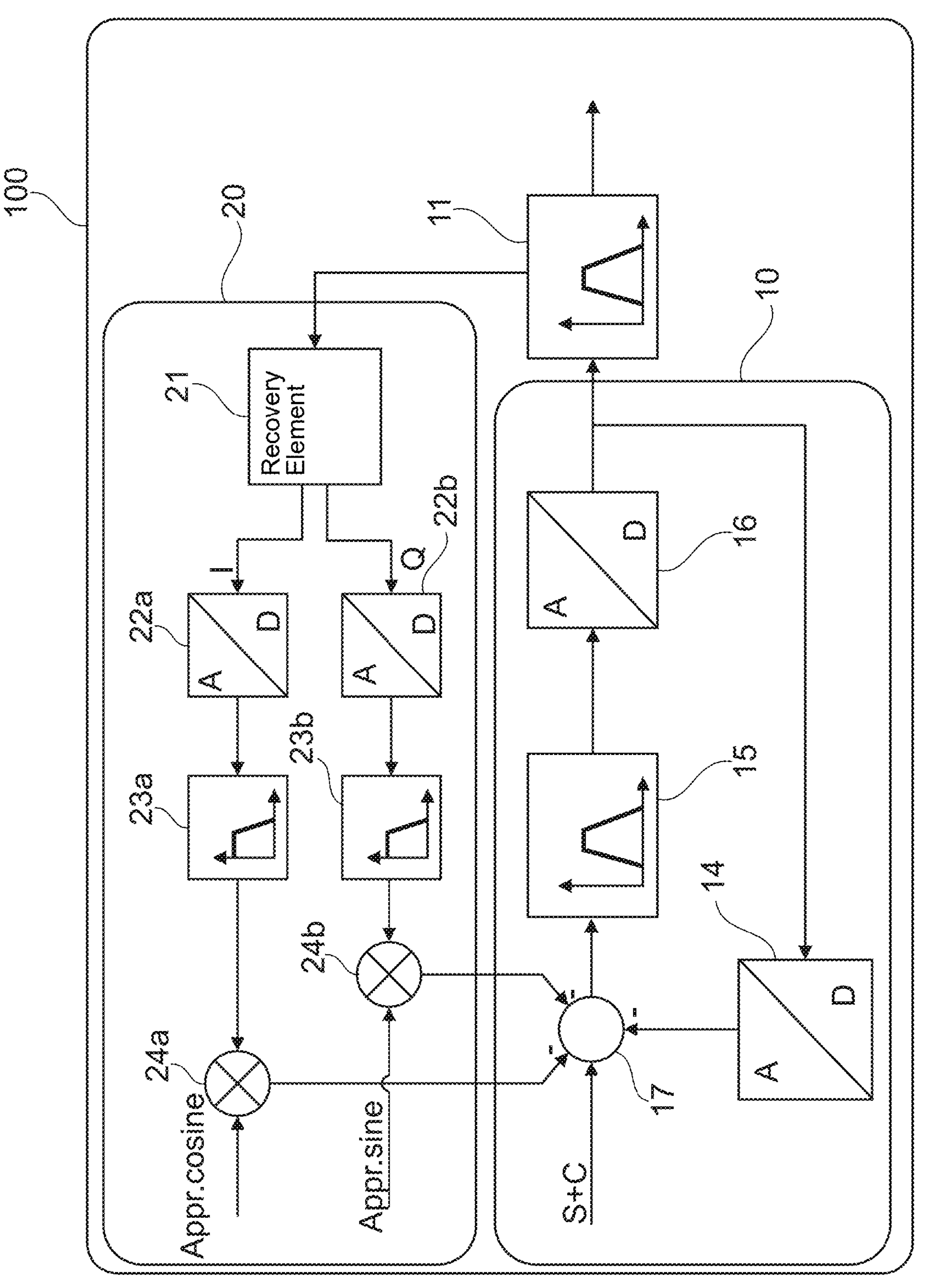
FIG. 6 shows a further embodiment of the proposed interferer cancellation device.

In the embodiment of the interferer cancellation device 100 shown in FIG. 6, the carrier recovery element 21 does not generate a signal at the carrier frequency, but quadrature signals I, Q, equivalent to the down-converted baseband of the carrier signals. To this end, in the carrier recovery element 21 the signal is multiplied with the actual center frequency of the carrier.

With the arrangement of FIG. 6 with the mentioned low pass filter 23*a*, 23*b* after the I/Q DACs with following up-conversion to the center frequency of the carrier, the previously stated band-pass filter around the carrier is in some cases the lower effort solution compared to a directly implementing a band-pass around the carrier. Also the sampling frequency of the I/Q DACs can be much lower compared to a single DAC directly reconstructing the carrier at their center frequency. This is why the I/Q up-conversion architecture is proposed for applications where the to-be-cancelled carrier (or other narrow baseband components) needs to tracked during data reception.

These I/Q baseband feedback DACs 22*a*, 22*b* can be low speed and high resolution or just low-speed with additional low pass filters 23*a*, 23*b* afterwards to reduce Q-noise passing in the wanted side-band frequencies of the incoming data. The reconstructed carrier $C_r$ in baseband is then upconverted to center frequency of the carrier, with low-harmonic mixers and then subtracted at the subtracter 17 of the device 10.

Figures 7, 8:
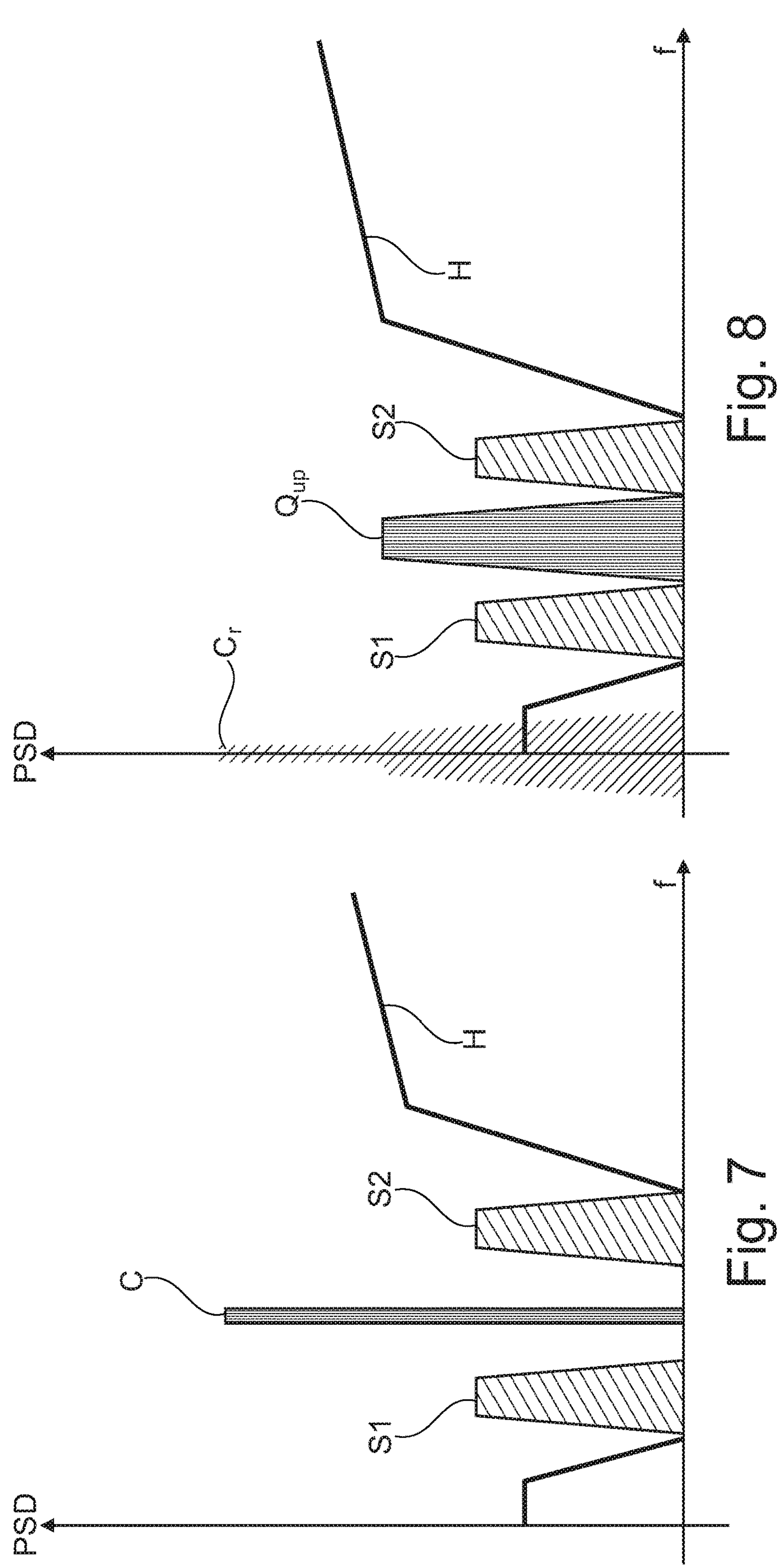
FIG. 7 shows a power spectral density diagram at the input of the device before a removal of the carrier.
FIG. 8 shows a power spectral density diagram at the input of the device after a removal of the carrier.

FIG. 7 shows circumstances in the frequency domain as having explained above with respect to FIG. 2. One recognizes a power spectral density diagram (PSD) before the strong carrier C was removed. One recognizes a strong carrier C, together with rather weak wanted sideband modulations S1, S2 of the wanted modulation signal S. The strong carrier C can overdrive the device 10 in high gain mode. A noise transfer of BP-SDADC is indicated by a diagram H. The quantization error of the wide-bandwidth feedback DAC 14 is shaped to optimize dynamic range for the wanted modulation signal S.

FIG. 8 shows power spectral density diagram PSD after the carrier or interferer C has been removed, wherein the reconstructed carrier in baseband has cancelled a strong carrier after up-conversion with mixers 24*a* and 24*b*. One recognizes that the strong carrier C from FIG. 7 has been removed and only the up-converted and low-pass filtered quantization error of the DACs 22*a* and 22*b* remain together with weak sidebands S1, S2 of the wanted modulation signal. The remaining upconverted noise $Q_{up}$ from the carrier reconstruction DACs 22*a*, 22*b* is not interfering with the wanted weak sidebands S1, S2 and in contrary to the carrier or interferer C do not overdrive the device 10 (which digitizes the remaining antenna signal S and $Q_{up}$) anymore. In order to maximize the gain of the device 10 and its sensitivity, the carrier C is removed.

The signal Q indicates an output from the feedback DACs 22*a*, 22*b* after the bandpass filter. One recognizes a strong DC component, which is the signal which is intended to be cancelled. On top you have quantization error if the DACs are changing their output value during amplitude/phase tracking and adjusting during the frame. However, the noise is bandlimited by the filters in the arrangement of FIG. 6. By means of the low pass filters 23*a*, 23*b* the noise is cut off and after up-conversion, it does not interfere with the sidebands S1, S2. By means of the bandwidth restricted feedback DACs 22*a*, 22*b* the quantization error does not interfere with the sidebands S1, S2 of the wanted signal S.

Not shown are the harmonic components ("n×fc") generated by the up-conversion mixers. Similar to the diagram of FIG. 3 they are far outside the frequency range of the wanted data signal S. One recognizes that by means of the proposed method separate I/Q feedback DACs 22*a*, 22*b* which Q-noise is focused at a narrow bandwidth around the carrier or interferer C are not interfering with the modulation side bands S1, S2.

Figure 9:
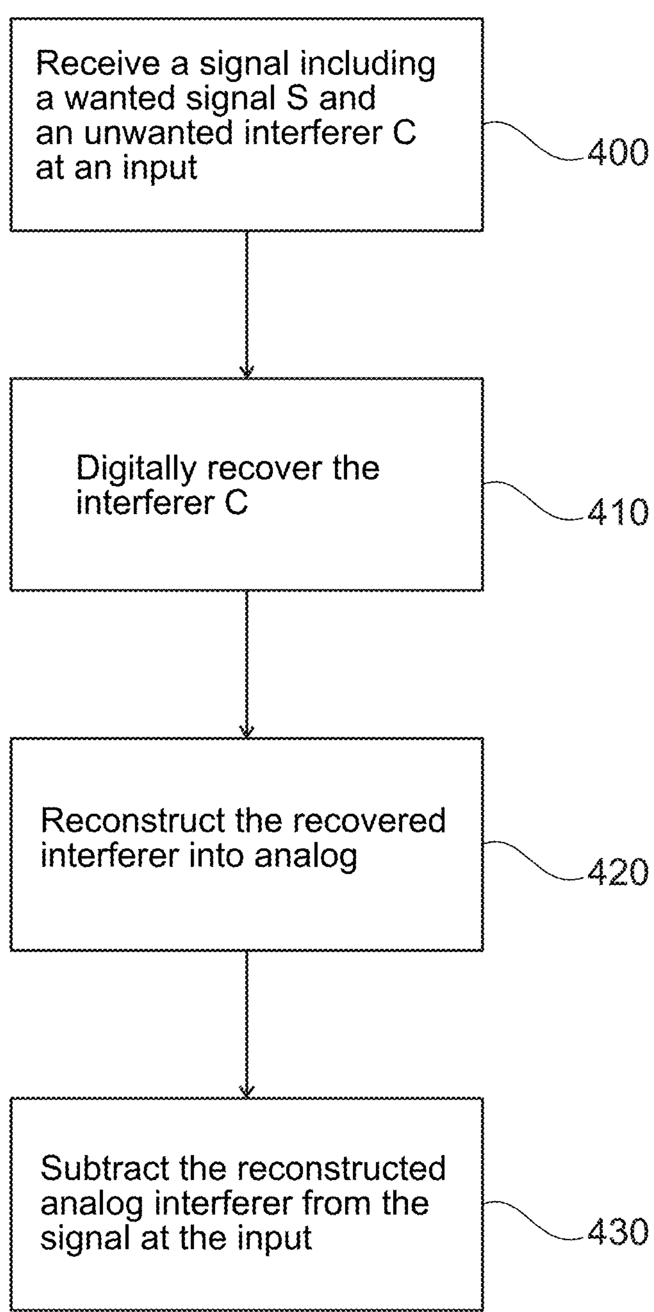
FIG. 9 shows a flow diagram of the proposed method.

FIG. 9 shows a flow of the proposed method.

In a step 400 a signal comprising a wanted signal S is received together with an unwanted interferer C at an input 1.

In a step 410 the interferer C is recovered into digital.

In a step 420 the recovered interferer is reconstructed into analog.

In a step 430 the reconstructed interferer $C_r$ is subtracted from the signal at the input 1.

The present disclosure is applicable in areas, where a narrow band signal shall be removed from a received broadband signal: e.g. FMCW radar, with a strong carrier at his own transmitter, wherein, due to limited isolation between transmitter and receiver, not only reflection signals are received but also the own carrier generated by the transmitter. Also conceivable is an application in the field of Ultra Wide Band (UWB), where e.g. WiFi-systems can interfere due to similar frequency ranges or other direct sequence spread spectrum communication systems (DSSS).

The disclosure has exemplary been shown in the context of Near Field Communication (NFC), where a strong carrier signal generated by the reader device is used to supply a passive tag (card) over the magnetic field. At the same time, the card is using this field to modulate the data back to the reader device which is received by reader as weak change in amplitude on the antenna. The reader must be able to successfully demodulate the weak data signal of the card with the presence of the strong carrier signal of its own transmitter. Instead of an ADC there could also be a high gain amplifier where the carrier or interferer is removed to not overdrive the amplifier.

However, the skilled person will recognize that the same or a slightly modified principle can be used for any system, where a strong signal overlays a weaker wanted signal (e.g. in radar, bi-directional RF communication, applications with strong external interferers, e.g. IR-UWB, etc. While disclosed for NFC, the present disclosure can also be applied to other technical areas with high power interferers, e.g. FMCW radar (with the problem of similar self interferences) or UWB (with the problem of WiFi-jammers).

The proposed method can be implemented at least partially as a software which can be stored in a computer readable memory or at least partially as a firmware or at least partially as a hardware (e.g. an NFC IC).

It should be noted that the term “comprising” does not exclude other elements or steps and “a” or “an” does not exclude a plurality. Also elements described in association with different embodiments may be combined. It should also be noted that reference signs in the claims should not be construed as limiting the scope of the claims.

The systems and methods described herein may at least partially be embodied by a computer program or a plurality of computer programs, which may exist in a variety of forms both active and inactive in a single computer system or across multiple computer systems. For example, they may exist as software program(s) comprised of program instructions in source code, object code, executable code or other formats for performing some of the steps. Any of the above may be embodied on a computer readable medium, which may include storage devices and signals, in compressed or uncompressed form. As used herein, the term “computer” refers to any electronic device comprising a processor, such as a general-purpose central processing unit (CPU), a specific-purpose processor or a microcontroller. A computer is capable of receiving data (an input), of performing a sequence of predetermined operations thereupon, and of producing thereby a result in the form of information or signals (an output). Depending on the context, the term “computer” will mean either a processor in particular or more generally a processor in association with an assemblage of interrelated elements contained within a single case or housing.

The term “processor” or “processing unit” refers to a data processing circuit that may be a microprocessor, a co-processor, a microcontroller, a microcomputer, a central processing unit, a field programmable gate array (FPGA), a programmable logic circuit, or any circuit that manipulates signals (analog or digital) based on operational instructions that are stored in a memory. The term “memory” refers to a storage circuit or multiple storage circuits such as read-only memory, random access memory, volatile memory, non-volatile memory, static memory, dynamic memory, Flash memory, cache memory, or any circuit that stores digital information.

As used herein, a “computer-readable medium” or “storage medium” may be any means that can contain, store, communicate, propagate, or transport a computer program for use by or in connection with the instruction execution system, apparatus, or device. The computer-readable medium may be, for example but not limited to, an electronic, magnetic, optical, electromagnetic, infrared, or semiconductor system, apparatus, device, or propagation medium. More specific examples (non-exhaustive list) of the computer-readable medium may include the following: an electrical connection having one or more wires, a portable computer diskette, a random-access memory (RAM), a read-only memory (ROM), an erasable programmable read-only memory (EPROM or Flash memory), an optical fiber, a portable compact disc read-only memory (CDROM), a digital versatile disc (DVD), a Blu-ray disc (BD), and a memory card.

It is noted that the embodiments above have been described with reference to different subject-matters. In particular, some embodiments may have been described with reference to method-type claims whereas other embodiments may have been described with reference to apparatus-type claims. However, a person skilled in the art will gather from the above that, unless otherwise indicated, in addition to any combination of features belonging to one type of subject-matter also any combination of features relating to different subject-matters, in particular a combination of features of the method-type claims and features of the apparatus-type claims, is considered to be disclosed with this document. Moreover, it is noted that in an effort to provide a concise description of the illustrative embodiments, implementation details which fall into the customary practice of the skilled person may not have been described. It should be appreciated that in the development of any such implementation, as in any engineering or design project, numerous implementation-specific decisions must be made in order to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill.

It has to be noted that embodiments have been described with reference to different subject matters. In particular, some embodiments have been described with reference to method type claims whereas other embodiments have been described with reference to apparatus type claims. However, a person skilled in the art will gather from the above and the following description that, unless other notified, in addition to any combination of features belonging to one type of subject matter also any combination between features relating to different subject matters, in particular between features of the method type claims and features of the apparatus type claims is considered as to be disclosed with this application. Improved dynamic range for direct-sampling RF receivers with reduced power and area compared to conventional direct sampling receiver. The disclosure was part of an NFC reader device to solve the issue of receiving weak modulation signals from an NFC card, while the TX of the very same IC is transmitting a high-power constant-wave carrier to the card for power supply. The wanted modulation data can be −80 dB down in level compared to the strong carrier signal.

REFERENCE NUMERALS

1 input
2 output
10 device
11 decimation filter
14 operation DAC
15 loop filter
16 ADC
17 subtracter
20 feedback device
21 carrier recovery element
22*a*, 22*b* feedback DAC
23*a*, 23*b* low pass filter
24*a*, 24*b* up-conversion mixer
30 transmitter
31 modulator
32 power amplifier
100 Interferer cancellation device

200 NFC reader
210 antenna
300 card
310 antenna
400 . . . 430 method steps
C interferer
S modulated signal
t time

What is claimed is:

1. An interferer cancellation device comprising:

a device with an antenna input to receive a signal and including an output, wherein the signal comprises a wanted signal together with an unwanted interferer, the device comprises:

a subtractor including a first subtractor input coupled to the antenna input to receive the signal, a second subtractor input, a third subtractor input, and a subtractor output, the subtractor configured to subtract a second signal at the second subtractor input and a third signal at the third subtractor input from the signal at the first subtractor input to produce the wanted signal at the subtractor output;

a first analog-to-digital converter (ADC) including an ADC input coupled to the subtractor output and including an ADC output, the first ADC configured to convert a signal at the subtractor output into a digital output signal at the ADC output;

a feedback loop including a first digital-to-analog converter (DAC) between the ADC output and the second subtractor input, the first DAC configured to provide the second signal; and a decimation filter including a filter input coupled to the ADC output, a first filter output coupled to the output of the device, and a second filter output;

a feedback device comprising:

a recovery element including an input coupled to the second filter output and including at least one output, the recovery element configured to reconstruct the unwanted interferer interfering with the wanted signal into digital based on the digital output signal; and one or more second DACs, each second DAC including an input coupled to one of the at least one output of the recovery element and including an output coupled to the third subtractor input to provide an analog version of the reconstructed unwanted interferer; and wherein the subtractor subtracts the reconstructed unwanted interferer and a feedback signal of the feedback loop from the received signal at the antenna input to produce the wanted signal at the subtractor output.

2. The interferer cancellation device according to claim 1, characterized in that at least one second DAC of the one or more second DACs is built such that quantization error resulting in harmonic content of the at least one second DAC are outside of side bands of the signal.

3. The interferer cancellation device according to claim 2, characterized in that quantization errors generated by the at least one second DAC are defined weaker than the unwanted interferer.

4. The interferer cancellation device according to claim 3, characterized in that the feedback device comprises two feedback DACs.

5. The interferer cancellation device according to claim 2, characterized in that the feedback device comprises two feedback DACs.

6. The interferer cancellation device according to claim 1, characterized in that a band-pass filter is used to limit a bandwidth of the one or more second DACs, such that a quantization error of the one or more second DACs does not interfere with sidebands of the signal.

7. The interferer cancellation device according to claim 6, characterized in that the feedback device comprises two feedback DACs.

8. The interferer cancellation device according to claim 1, characterized in that the one or more second DACs of the feedback device comprises two second DACs.

9. The interferer cancellation device according to claim 8, characterized in that low pass filters in quadrature baseband are used to limit a bandwidth of the two second DACs, such that a quantization error of the two second DACs does not interfere with the signal.

10. The interferer cancellation device according to claim 8, characterized in that a carrier baseband signal, reconstructed by the two second DACs, is up-converted to a center frequency of the unwanted interferer using up-conversion mixers.

11. The interferer cancellation device according to claim 9, characterized in that the interferer cancellation device is a bandpass Sigma Delta ADC.

12. The interferer cancellation device according to claim 8, wherein the one or more second DACs of the feedback device are narrow-bandwidth feedback DACs compared to a wide-bandwidth of a first DAC that is a noise-shaping DAC of a Sigma Delta analog-to-digital converter (ADC).

13. The interferer cancellation device according to claim 1, wherein the unwanted interferer is a periodic-steady carrier.

14. The interferer cancellation device according to claim 13, characterized in that the feedback device comprises two feedback DACs.

15. A method to operate a carrier cancellation device, the method comprising:

receiving a signal comprising a wanted signal together with an unwanted interferer at an input;

filtering and digitizing the signal to produce a digital output signal;

producing an analog feedback signal from the digital output signal;

filtering the digital output signal with a decimation filter to produce a filtered output signal;

recovering, using a recover element, the unwanted interferer based on the filtered digital output signal;

reconstructing an analog reconstructed recovered unwanted interferer based on the recovered unwanted interferer; and subtracting the analog feedback signal and the analog reconstructed recovered unwanted interferer from the signal at the input to determine the wanted signal.

16. The method according to claim 15, wherein the recovering of the unwanted interferer and a band-width limitation of the recovered unwanted interferer is carried out in quadrature baseband.

17. The method of claim 15, wherein producing an analog feedback signal from the digital output signal comprises:

converting the digital output signal into the analog feedback signal using a digital-to-analog converter (DAC); and wherein the DAC has a frequency band configured around a frequency of the received signal.

18. The method of claim 15, wherein reconstructing an analog reconstructed recovered unwanted interferer based on the recovered unwanted interferer comprises:

converting the recovered unwanted interferer from a digital signal into the analog reconstructed recovered unwanted interferer using a feedback digital-to-analog converter (DAC); and wherein the analog reconstructed recovered unwanted interferer corresponds to a carrier of the received signal.

* * * * *